United States Patent [19]

Freadman

[11] Patent Number: 4,625,328
[45] Date of Patent: Nov. 25, 1986

[54] INTEGRATED AMPLIFIER AND SPEAKER SYSTEM WITH IMPROVED COOLING EFFICIENCY

[75] Inventor: Tommyca Freadman, Taipei, Taiwan

[73] Assignee: Konutra Industries, Ltd., Taipei, Taiwan

[21] Appl. No.: 598,437

[22] Filed: Apr. 9, 1984

Related U.S. Application Data

[63] Continuation-in-part of Ser. No. 503,830, Jun. 13, 1983.

[51] Int. Cl.⁴ .............................................. H04R 3/00
[52] U.S. Cl. ...................................... 381/111; 381/87
[58] Field of Search ...................... 381/87, 88, 89, 90, 381/111, 96, 117; 179/115 R, 146 E; 361/384

[56] References Cited

U.S. PATENT DOCUMENTS 2,567,829  9/1951  Suthann .......................... 179/115 R

FOREIGN PATENT DOCUMENTS 2729343  1/1979  Fed. Rep. of Germany ........ 381/87
2948034  6/1981  Fed. Rep. of Germany ........ 381/88

Primary Examiner—Forester W. Isen
Attorney, Agent, or Firm—Spensley Horn Jubas & Lubitz

[57] ABSTRACT

An integrated amplifier and speaker system is disclosed which is designed to use air waves produced by the excursion of the speaker diaphragm together with a heat sink for maintaining the temperature of the power transistors within a safe operating range at or below a desired maximum temperature level. By integrally designing the speaker and the amplifier, the increase in cooling capability provided by the speaker diaphragm excursion allows for the use of a heat sink having an area or heat dissipating capability lower than that required had the system not been integrally designed.

10 Claims, 2 Drawing Figures

U.S. Patent    Nov. 25, 1986    4,625,328
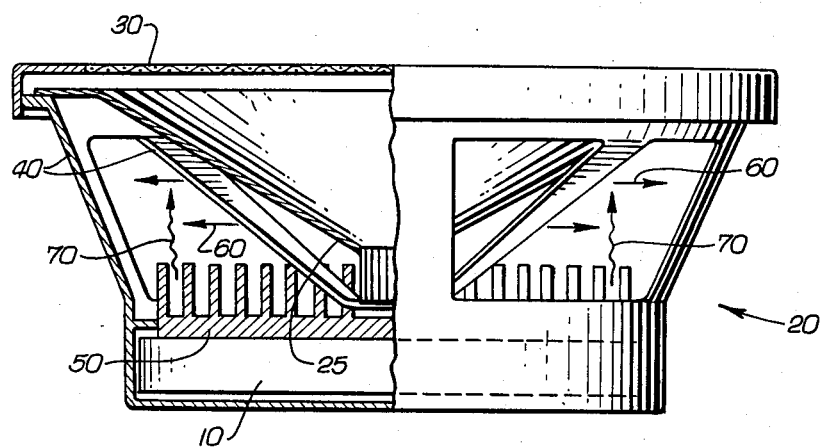
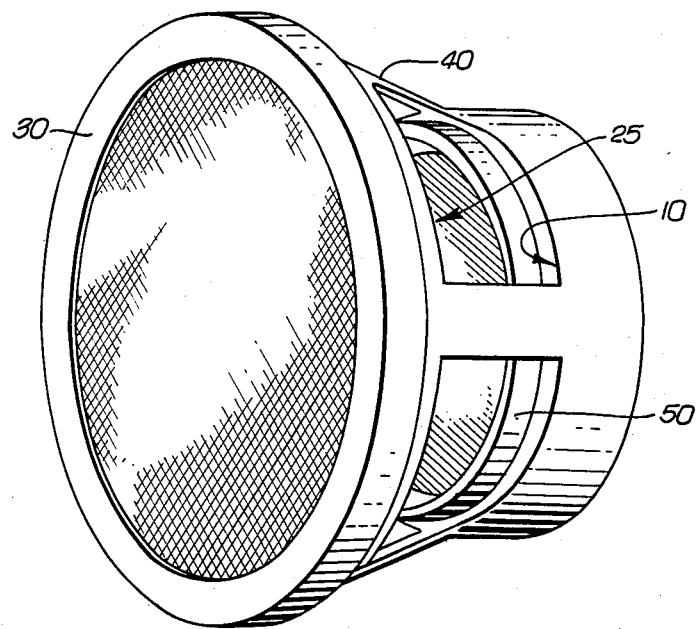

INTEGRATED AMPLIFIER AND SPEAKER SYSTEM WITH IMPROVED COOLING EFFICIENCY

BACKGROUND OF THE INVENTION

1. Cross-Reference to Related Application

This application is a continuation in part of co-pending application Ser. No. 503,830, filed June 13, 1983.

2. Field of the Invention

This invention relates to an integrated amplifier and speaker system with improved cooling efficiency. More particularly, the present invention relates to an amplifier and speaker system which utilizes the amplifier heat sink and speaker diaphragm excursion in tandem to maintain the temperature of the power transistors of the amplifier within a safe temperature operating range at or below the desired maximum temperature level of the transistors. More specifically, the present invention relates to such an amplifier and speaker system which is adapted for use in an automobile.

3. Description of the Prior Art

Prior art amplifiers typically include a heat sink, for example, aluminum fins, to dissipate heat generated by the power transistors. The heat sink is of sufficient size to maintain the power transistors within a safe operating temperature range. In operation, heat generated by the power transistors is dissipated by the conductively connected heat sink, thereby maintaining the temperature of the power transistors at or below a desired maximum temperature level. The heat sink may comprise a substantial portion of the cost of the amplifier and speaker system as a whole.

Most amplifiers are housed separately from the speaker. Self-powered speakers have also been developed, that is, where the amplifier is designed for the particular speaker and where the amplifier and speaker are constructed as an integral unit, for example, the amplifier is housed in the speaker cabinet. For both prior art separate and self-powered speakers, heat dissipation for the amplifier is typically provided entirely by a heat sink or, in some cases, by a heat sink with a fan for forced air cooling. As a general rule, the larger the heat sink, the higher the cost for the amplifier and speaker system.

The particular heat sink is chosen depending in part upon the maximum output of the power transistors. Thus for particular output power transistors, a heat sink is chosen having a sufficient heat dissipating capability or, for example, sufficient area, to maintain the temperature of the power transistors at or below the desired maximum temperature level at maximum output and within a safe temperature operating range. For high power amplifiers in particular, the heat sink chosen is massive, thereby increasing both the cost and bulk of the amplifier.

SUMMARY OF THE INVENTION

The present invention is directed to an integrally designed speaker and amplifier system wherein the temperature of the power transistors can be maintained within a safe operating range by utilizing the amplifier heat sink in conjunction with air waves produced by excursion of the speaker diaphragm. More particularly, an integral amplifier and speaker system is disclosed wherein the vertex of a cone-shaped speaker is located adjacent the heat sink of an amplifier which contains power transistors. The excursion of the speaker diaphragm produces air waves which increase circulation in the area of the heat sink, thereby increasing the cooling efficiency of the heat sink. Due to the cooling effect provided by the speaker diaphragm excursion, a heat sink may be used having a heat dissipating capability significantly less than that which would otherwise be required to maintain the temperature of the power transistors at or below the desired maximum temperature level of the transistors. Since a heat sink having a lower heat dissipating capability, for example, reduced area, may be used, the overall costs and production constraints for the integrated amplifier and speaker system decrease.

It is therefore an object of the present invention to provide an integrated amplifier and speaker system which is designed to maintain the temperature of the power transistors within a safe operating range at or below a desired maximum temperature level.

It is a further object of the present invention to improve the cooling efficiency of an integrated amplifier and speaker system by using the cooling effect provided by the excursion of the speaker diaphragm together with a heat sink having a lower heat dissipating capability than would otherwise be required.

BRIEF DESCRIPTION OF THE DRAWINGS

The invention is illustrated, by way of example only, in the accompanying drawings in which:

FIG. 1 is a cut-away side view of the self-powered speaker of one embodiment of the present invention.

FIG. 2 is a perspective view of the self-powered speaker of one embodiment of the present invention.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by the appended claims.

Referring to FIG. 1, a power amplifier 10 is attached to the rear portion of a speaker unit 20 thereby forming an integral amplifier and speaker system. The speaker unit 20 includes grill 30, frame 40, and diaphragm 25. The air waves produced by the excursion of the speaker diaphragm (designated by arrows 60) facilitate the dissipation of heat generated by the power transistors (designated by arrows 70) contained in the amplifier by increasing the cooling efficiency of the heat sink. The present invention is particularly adapted for mounting in horizontally flat locations of an automobile, such as the rear deck. In such cases, the amplifier 10 and most of the speaker unit 20 are mounted below the rear deck, with the amplifier positioned below the speaker diaphragm.

In the embodiment shown in FIG. 1, a heat sink 50 comprised of a plurality of aluminum fins is located between the speaker diaphragm 25 and is conductively coupled to the power transistors contained in the power amplifier 10. In the embodiment shown in FIG. 2, the heat sink 50 is of a simple tubular configuration. The heat sink can be of many different configurations, shapes or materials that can be conductively coupled to the power transistors of an amplifier. In the configuration shown, the tubular heat sink facilitates directing the heat generated by the power transistors toward the speaker diaphragm thereby increasing the cooling effect provided by the speaker diaphragm.

The power transistors of the power amplifier 10 generate significant heat during their operation. The power transistors are designed to be operated within a safe operating temperature range at or below a desired maximum temperature level. However, without any means to regulate the temperature of the power transistors, the power transistors will increase in temperature and the amplifier will overheat or shut down (if it includes thermal protection).

The integrally designed amplifier and speaker system of the present invention uses a heat sink together with the air waves produced by the excursion of the speaker diaphragm to provide sufficient heat dissipation to maintain the temperature of the power transistors at or below a desired maximum temperature level. As the power amplifier 10 operates, heat generated by the power transistors is conducted by the heat sink 50. The heat sink 50 dissipates some of the heat. The air waves produced by the excursion of the speaker diaphragm 25 increase circulation in the area of the heat sink thereby increasing the heat dissipation capabilities of the heat sink. As a result, the cooling efficiency of the heat sink is increased and the temperature of the power transistors is maintained within a safe operating range at or below the desired maximum temperature level. Furthermore, the cost of the system can be maintained quite low since the need for either a large heat sink or a fan is eliminated.

Another feature of the present invention is that the cooling effect provided by the speaker diaphragm excursion is self-adjusting. In other words, as the output of the power transistors increases, the amount of generated heat increases, but the excursion of the speaker diaphragm also increases. Thus, during increased heating of the power transistors due to the increasing drive signal, the speaker diaphragm will further increase air circulation in the area of the heat sink and the amplifier. Thus, even during maximum power output, the in-tandem use of the heat sink and speaker diaphragm excursion provides sufficient heat dissipation to maintain the temperature of the power transistors at or below the maximum desired temperature level.

Typically, an output transistor has a recommended amount of heat sink area or heat dissipating capability which is necessary to maintain the temperature of the transistors within a safe operating range. In the present invention, however, a heat sink having lesser area or lesser heat dissipating capability can be used due to the integral design of the speaker and the amplifier. Thus, in one embodiment of the present invention, an amplifier having a 30-watt output capability is provided with a a heat sink having an area which is normally recommended for an 8-watt amplifier. Utilization of the forced air cooling provided by the speaker diaphragm excursion increases the cooling efficiency of the system so that sufficient heat dissipation is achieved even with a small heat sink area. Notwithstanding the use of a heat sink recommended for an amplifier having an 8-watt output, the temperature of the power transistors of the 30-watt amplifier is still maintained at or below the desired maximum temperature level of the 30-watt power transistors.

As discussed above, the integral design of the present invention results in a substantial cost saving due to the tandem use of the speaker diaphragm excursion and a heat sink having a lesser area than would otherwise be required. Moreover, a finned heat sink is not required, and a simple tubular heat sink design is sufficient.

It should be appreciated that the present invention is directed to an integrated amplifier and speaker system in which the effects of the speaker motion are actually taken into account in selecting a proper heat sink. To illustrate, if the amplifier is driven to maximum power output with the speaker electrically disconnected, the heat sink of the present invention alone will not be sufficient to maintain the temperature of the power transistors at or below the desired maximum temperature level. In such an instance, if the amplifier and speaker system of the present invention is provided with thermal protection, disconnection of the speaker will cause the thermal protector to be activated. With the speaker connected, the speaker excursion increases the air circulation around the heat sink so that more heat is dissipated, and shutdown does not occur. Therefore, it is the integrated design of the amplifier and speaker system which facilitates the use of a relatively small heat dissipating capability heat sink to improve the cooling efficiency of the system as a whole.

What is claimed is:

1. An integrated amplifier and speaker system comprising:
   a speaker diaphragm; and
   a power amplifier disposed adjacent to the speaker diaphragm so that air waves produced by excursion of the speaker diaphragm are directed toward the amplifier, the power amplifier operationally connected to drive the speaker diaphragm, the power amplifier having one or more power transistors having a specified maximum operating temperature level, said power amplifier including a heat sink conductively connected to the power transistors, wherein the heat sink in the absence of circulating air is insufficient to maintain the temperature of the power transistors below the specified maximum temperature level and wherein use of the heat sink member together with the air waves produced by the speaker diaphragm maintains the temperature of the power transistors at or below the specified maximum temperature level.

2. An integrated amplifier and speaker system according to claim 1 wherein the speaker diaphragm is cone-shaped and the vertex of the speaker diaphragm is adjacent the heat sink member.

3. An integrated amplifier and speaker system according to claim 2 wherein the heat sink member is generally tubular and the vertex of the speaker diaphragm is located generally at the center of the heat sink member.

4. An integrated amplifier and speaker system according to claim 1 wherein the heat sink member includes a plurality of fins.

5. An integrated amplifier and speaker system according to claim 3 wherein the heat sink member comprises aluminum.

6. An integrated amplifier and speaker system comprising:
   a speaker diaphragm;
   a power amplifier for driving the speaker diaphragm, the power amplifier including power transistors having a predetermined maximum operating temperature level; and
   a heat sink member having an upper surface which is exposed to air waves produced by excursion of the speaker diaphragm, the heat sink member being conductively coupled to the power transistors and being insufficient to maintain the temperature of the power transistors at or below the predetermined maximum temperature level in the absence of said air waves, wherein the air waves together with the heat sink member maintain the temperature of the power transistors at or below the predetermined maximum temperature level.

7. An integrated amplifier and speaker system according to claim 6 wherein the heat sink member is generally tubular and the speaker diaphragm is cone-shaped.

8. A self-powered speaker system comprising:
an amplifier having output transistor means and a heat sink for dissipating heat generated by the output transistor means, said heat sink alone having a heat dissipating capability which is insufficient to maintain the output transistor means within a safe operating temperature range;
speaker means including a diaphragm driven by the amplifier, wherein said diaphragm is located adjacent the heat sink so that diaphragm movement increases air circulation in the area of the heat sink thereby improving the heat dissipation capability of the heat sink, wherein the combined operation of the heat sink and diaphragm movement provide sufficient heat dissipation capability to maintain the output transistor means within the safe operating temperature range.

9. A self-powered speaker system according to claim 8 which is adapted for mounting in the rear deck of an automobile, wherein the amplifier is positioned below the diaphragm and wherein the diaphragm is conical, whereby heat will rise from the amplifier and be expelled outwardly by the movement of the speaker diaphragm.

10. A self-powered speaker system according to claim 9 wherein the heat sink is tubular.

* * * * *